(12) United States Patent
Lee et al.

(10) Patent No.: US 11,768,415 B2
(45) Date of Patent: Sep. 26, 2023

(54) DISPLAY DEVICE

(71) Applicant: LG DISPLAY CO., LTD., Seoul (KR)

(72) Inventors: Jinuk Lee, Paju-si (KR); Il Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/942,597

(22) Filed: Sep. 12, 2022

(65) Prior Publication Data

US 2023/0004056 A1    Jan. 5, 2023

Related U.S. Application Data

(63) Continuation of application No. 17/130,216, filed on Dec. 22, 2020, now Pat. No. 11,474,404.

(30) Foreign Application Priority Data

Dec. 23, 2019 (KR) .................... 10-2019-0173424

(51) Int. Cl.
| | | |
|---|---|---|
| G02F 1/1362 | (2006.01) | |
| G02F 1/1343 | (2006.01) | |
| G02F 1/1333 | (2006.01) | |
| G06F 3/044 | (2006.01) | |
| G06F 3/041 | (2006.01) | |
| H01L 27/12 | (2006.01) | |
| G09G 3/36 | (2006.01) | |
| G02F 1/1368 | (2006.01) | |

(52) U.S. Cl.
CPC .... *G02F 1/136286* (2013.01); *G02F 1/13338* (2013.01); *G02F 1/134318* (2021.01); *G06F 3/0412* (2013.01); *G06F 3/04166* (2019.05); *G09G 3/3648* (2013.01); *H01L 27/124* (2013.01); *G02F 1/13685* (2021.01); *G02F 1/134363* (2013.01); *G02F 2201/121* (2013.01); *G02F 2201/123* (2013.01)

(58) Field of Classification Search
CPC . G06F 3/0412; G06F 3/0443; G02F 1/136286
See application file for complete search history.

(56) References Cited

U.S. PATENT DOCUMENTS

| | | | |
|---|---|---|---|
| 2007/0200992 A1* | 8/2007 | Kim | G02F 1/1362 349/143 |
| 2011/0227850 A1* | 9/2011 | Oh | G06F 3/0446 445/24 |

(Continued)

FOREIGN PATENT DOCUMENTS

| | | |
|---|---|---|
| KR | 10-2019-0081852 A | 7/2019 |
| KR | 10-2019-0100140 A | 8/2019 |

*Primary Examiner* — Nan-Ying Yang
(74) *Attorney, Agent, or Firm* — POLSINELLI PC

(57) ABSTRACT

A display device including a pixel electrode disposed in an opening area; a common electrode of which at least a region is disposed to be overlapped with the pixel electrode; a gate line extending along a first direction in a non-opening area surrounding the opening area and transmitting a gate signal to the pixel electrode; a data line extending along a second direction different from the first direction in the non-opening area, and transmitting a data signal to the pixel electrode; and a dummy line disposed to be overlapped with the data line in the non-opening area and electrically connected to the common electrode.

18 Claims, 10 Drawing Sheets

(56) References Cited

U.S. PATENT DOCUMENTS

| | | | |
|---|---|---|---|
| 2016/0062164 A1* | 3/2016 | Chae | G02F 1/13338 349/12 |
| 2016/0202544 A1* | 7/2016 | Ro | G02B 5/201 445/24 |
| 2017/0176797 A1* | 6/2017 | Kim | H01L 27/1248 |
| 2018/0019264 A1* | 1/2018 | Kim | H01L 27/1259 |

* cited by examiner

DISPLAY DEVICE

CROSS-REFERENCE TO RELATED APPLICATIONS

The application is a continuation of U.S. patent application Ser. No. 17/130,216, filed on Dec. 22, 2020, which claims the benefit of Korean Patent Application No. 10-2019-0173424 filed on Dec. 23, 2019, which are hereby incorporated by reference in their entirety for all purposes as if fully set forth herein.

BACKGROUND

Field of the Disclosure

The present disclosure relates to a display device.

Description of the Background

As information society develops, various types of display devices have been developed. Recently, various display devices, such as a liquid crystal display (LCD), a plasma display panel (PDP), and an organic light emitting display (OLED) have been used.

Recently, a touch screen capable of displaying an image and sensing a user's touch has been widely used. The touch screen may have a structure of an add-on type, an on-cell type, and an in-cell type. Among them, the touch screen having the in-cell type structure can reduce the thickness and improve durability of the display device.

SUMMARY

Accordingly, the present disclosure provides a display device that can prevent a vertical band phenomenon from occurring at a boundary of touch blocks due to a dummy line in an in-cell type touch display device.

In addition, the present disclosure provides a display device in which a dummy line is electrically connected to a common electrode in a sub-pixel provided at a boundary of touch blocks.

A display device according to an aspect of the present disclosure includes a pixel electrode disposed in an opening area; a common electrode of which at least a region is disposed to be overlapped with the pixel electrode; a gate line extending along a first direction in a non-opening area surrounding the opening area and transmitting a gate signal to the pixel electrode; a data line extending along a second direction different from the first direction in the non-opening area, and transmitting a data signal to the pixel electrode; and a dummy line disposed to be overlapped with the data line in the non-opening area and electrically connected to the common electrode.

The dummy line may receive a common voltage transmitted to the common electrode during a display period of one frame.

The dummy line may be formed between the data line and the pixel electrode.

The display device may further include a bridge electrode connecting the common electrode and the dummy line.

The bridge electrode and the pixel electrode may be disposed on the same layer.

The bridge electrode may be an island-shaped electrode separated from the pixel electrode.

The common electrode may be formed for each of touch blocks, the touch blocks each including a plurality of sub-pixels.

The dummy line disposed at a boundary between the touch blocks each including the plurality of sub-pixels may be electrically connected to the common electrode.

The display device may further include a sensing line extending along the second direction in the non-opening area and transmitting a common voltage or a touch scan voltage to the common electrode.

A display device according to an aspect of the present disclosure includes a substrate on which an opening area and a non-opening area surrounding the opening area are defined; a first conductive layer disposed on the substrate and including a gate line extending along a first direction in the non-opening area; a second conductive layer disposed on the first conductive layer and including a data line extending along a second direction different from the first direction in the non-opening area; a dummy line disposed on the second conductive layer to be overlapped with the data line in the non-opening area; a common electrode disposed on the second conductive layer in the opening area; and a pixel electrode disposed on the common electrode in the opening area, wherein the dummy line is electrically connected to the common electrode.

The display device may further include a bridge electrode disposed on the same layer as the common electrode in the non-opening area, and connecting the common electrode and the dummy line.

The bridge electrode is an island-shaped electrode separated from the pixel electrode.

The common electrode may be formed for each of touch blocks, the touch blocks each including a plurality of sub-pixels.

The dummy line disposed at a boundary between the touch blocks each including the plurality of sub-pixels is electrically connected to the common electrode.

A display device according to an aspect of the present disclosure includes a display panel in which sub-pixels, common electrodes each disposed corresponding to one or more of the sub-pixels, and pixel electrodes of which at least a region is disposed to be overlapped with the common electrode are disposed; a gate driving unit applying a gate signal to the sub-pixels; a data driving unit applying a data signal to the sub-pixels; and a touch driving unit applying a common voltage or a touch scan voltage to the common electrodes, wherein the display panel includes gate lines transmitting gate signals to the pixel electrodes; data lines transmitting data signals to the pixel electrodes; and dummy lines each disposed to be overlapped with the data lines and electrically connected to at least one of the common electrodes.

In the display device according to the aspects, when the data voltage applied to a source electrode of the transistor is transferred to the dummy line, the voltage of the dummy line may be stabilized by applying a common voltage to the dummy line.

In the display device according to the aspects of the present disclosure, an electric field is formed between the pixel electrode and the dummy line to which the data voltage is transferred, thereby preventing a vertical band phenomenon from occurring.

BRIEF DESCRIPTION OF THE DRAWINGS

The accompanying drawings, which are included to provide a further understanding of the disclosure and are In the drawings.

DETAILED DESCRIPTION

Figure 1:
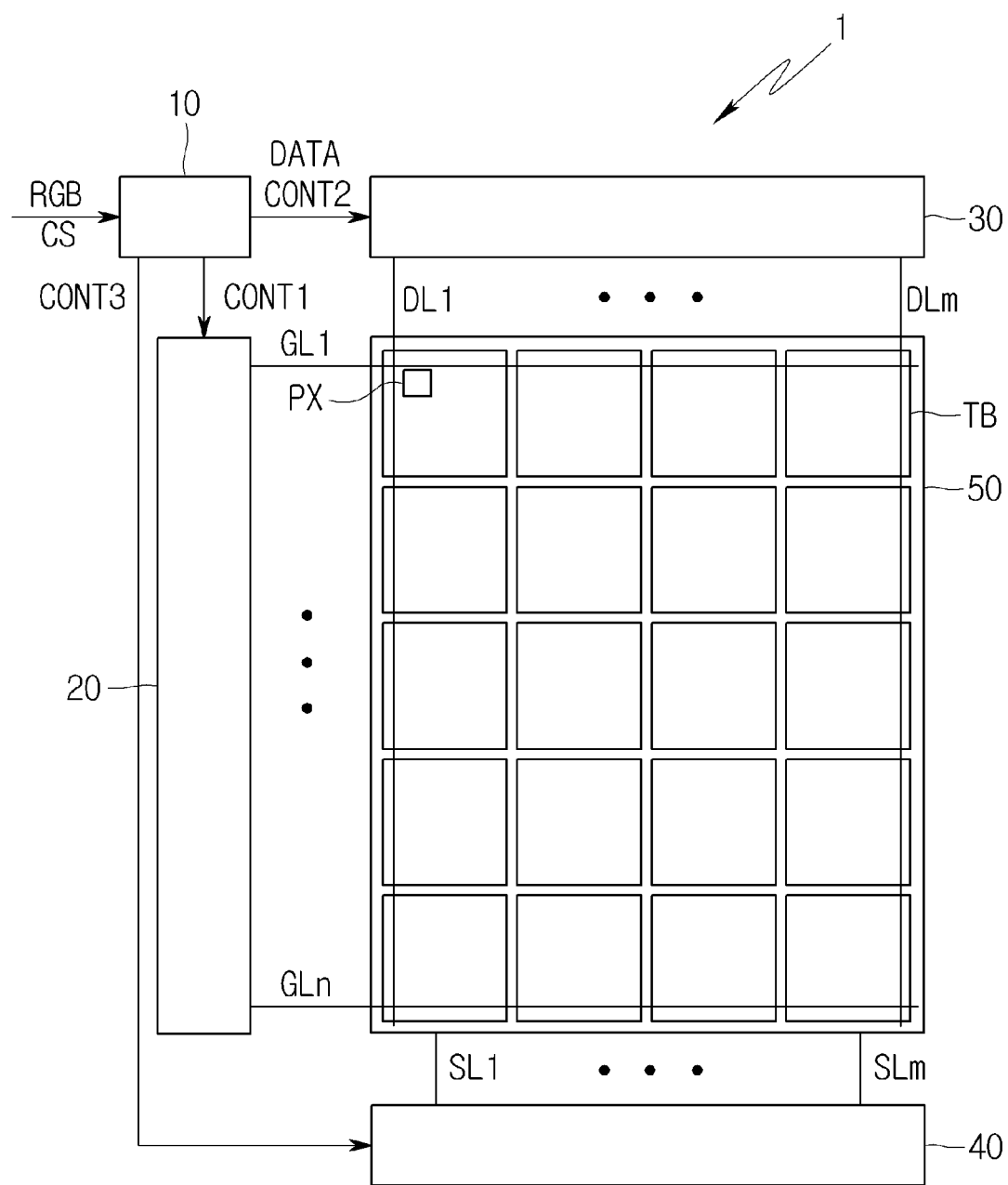
FIG. 1 is a block diagram illustrating a configuration of a display device according to an aspect of the present disclosure.

Hereinafter, aspects of the present disclosure will be described with reference to drawings. In this specification, when a component (or region, layer, part, etc.) is referred to as being "on", "connected" to, or "joined" to other component, it means that the component can be directly connected/coupled to the other component or a third component can be arranged between them.

The same reference numbers refer to the same components. In addition, in the drawings, the thickness, ratio, and dimension of the components are exaggerated for effective description of technical contents. An "and/or" includes one or more combinations capable of being defined by the associated configurations.

Terms such as "first" and "second" may be used to describe various components, but the components are not limited by the terms. The terms are used only for the purpose of distinguishing one component from other components. For example, the first component may be referred to as the second component without departing from a scope of right of the present aspects, and similarly, the second component may also be referred to as the first component. Singular expressions include plural expressions unless the context clearly indicates otherwise.

Terms such as "below", "lower", "above", "upper", etc. are used to describe the association of components shown in the figures. The terms are relative concepts and are explained based on the directions indicated in the drawings.

It should be understood that terms such as "comprise" or "have", etc. are intended to indicate that a feature, number, step, operation, component, part, or combination thereof is described in the specification, and that the possibility of the presence or addition of one or more of other features or numbers, steps, operations, components, parts, or these combinations thereof is not excluded in advance.

FIG. 1 is a block diagram illustrating a configuration of a display device according to an aspect of the present disclosure.

Referring to FIG. 1, a display device 1 includes a timing control unit 10, a gate driving unit 20, a data driving unit 30, a touch driving unit 40, and a display panel 50.

The timing control unit 10 may receive an image signal RGB and a control signal CS from the outside. The image signal RGB may include a plurality of grayscale data. The control signal CS may include, for example, a horizontal synchronization signal, a vertical synchronization signal, and a main clock signal.

The timing control unit 10 processes the image signal RGB and the control signal CS according to an operating condition of the display panel 50, to generate and output an image data, a gate drive control signal CONT1, a data drive control signal CONT2, and a touch driving control signal CONT3.

The gate driving unit 20 may be connected to sub-pixels PX of the display panel 50 through a plurality of gate lines GL1 to GLn. The gate driving unit 20 may generate gate signals on the basis of the gate driving control signal CONT1 output from the timing control unit 10. The gate driving unit 20 may provide the generated gate signals to the sub-pixels PXs through the plurality of gate lines GL1 to GLn.

The data driving unit 30 may be connected to sub-pixels PX of the display panel 50 through a plurality of data lines DL1 to DLm. The data driving unit 30 may generate data signals on the basis of the data driving control signal CONT2 and the image data DATA output from the timing control unit 10. The data driving unit 30 may provide the generated data signals to the sub-pixels PX through the plurality of data lines DL1 to DLm.

The touch driving unit 40 may be connected to sub-pixels PX of the display panel 50 through a plurality of sensing lines SL1 to SLm. The touch driving unit 40 may generate a touch scan signal on the basis of the touch driving control signal CONT3 output from the timing control unit 10 and provide the same to the sub-pixels PXs. The touch driving unit 40 may receive a touch sensing signal through a plurality of sensing lines SL1 to SLm and detect a touch input on the basis of the received touch sensing signal.

A plurality of sub-pixels PXs is disposed on the display panel 50. The sub-pixels PXs may be arranged in, for example, a matrix form on the display panel 50.

Each sub-pixel PX may be electrically connected to corresponding gate line and data line. The sub-pixels PX may emit light with luminance corresponding to the gate signals and the data signals supplied through the gate lines GL1 to GLn and the data lines DL1 to DLm.

Each sub-pixel PX may display any one of the first to third colors. According to an aspect, each sub-pixel PX may display any one of red, green, and blue colors. According to another aspect, each sub-pixel PX may display any one of cyan, magenta, and yellow colors. In various aspects, the sub-pixels PXs may be configured to display any one of four or more colors. For example, each sub-pixel PX may display any one of red, green, blue, and white colors.

The display panel 50 may be configured in an in-cell touch type panel capable of sensing a touch input. For example, the display panel 50 may be configured to include a common electrode that is driven by receiving a common voltage during a display period within one frame, and receiving a touch scan voltage during a touch detection period temporally separated from the display period within one frame. In this aspect, a plurality of sub-pixels PXs disposed on the display panel 50 may be grouped in a predetermined unit to form a touch block TB.

The touch block TB may include two or more sub-pixels PX. The common voltage for displaying an image during the display period and the touch scan voltage for detecting a touch during the touch detection period may be applied to a common electrode of sub-pixels PXs constituting the touch blocks TB. The common electrode may operate as a display driving electrode driving a liquid crystal together with a pixel electrode during the display period, and may operate as a touch sensing electrode detecting a touch position during the touch detection period. The touch blocks TBs may be sequentially driven for one frame, but are not limited thereto.

The timing control unit 10, the gate driving unit 20, the data driving unit 30, and the touch driving unit 40 may be each configured as a separate integrated circuit (IC) or may be configured as an integrated circuit in which at least a part thereof is integrated. For example, at least one of the data driving unit 30 and the touch driving unit 40 may be integrated with the timing control unit 10 to be configured as an integrated circuit.

In addition, although the gate driving unit 20 and the data driving unit 30 are shown as components separate from the display panel 50 in FIG. 1, at least one of the gate driving unit 20 and the data driving unit 30 may be configured in an in-panel manner as to be formed integrally with the display panel 50. For example, the gate driving unit 20 may be integrally formed with the display panel 50 according to a gate in panel (GIP) manner.

Figure 2:
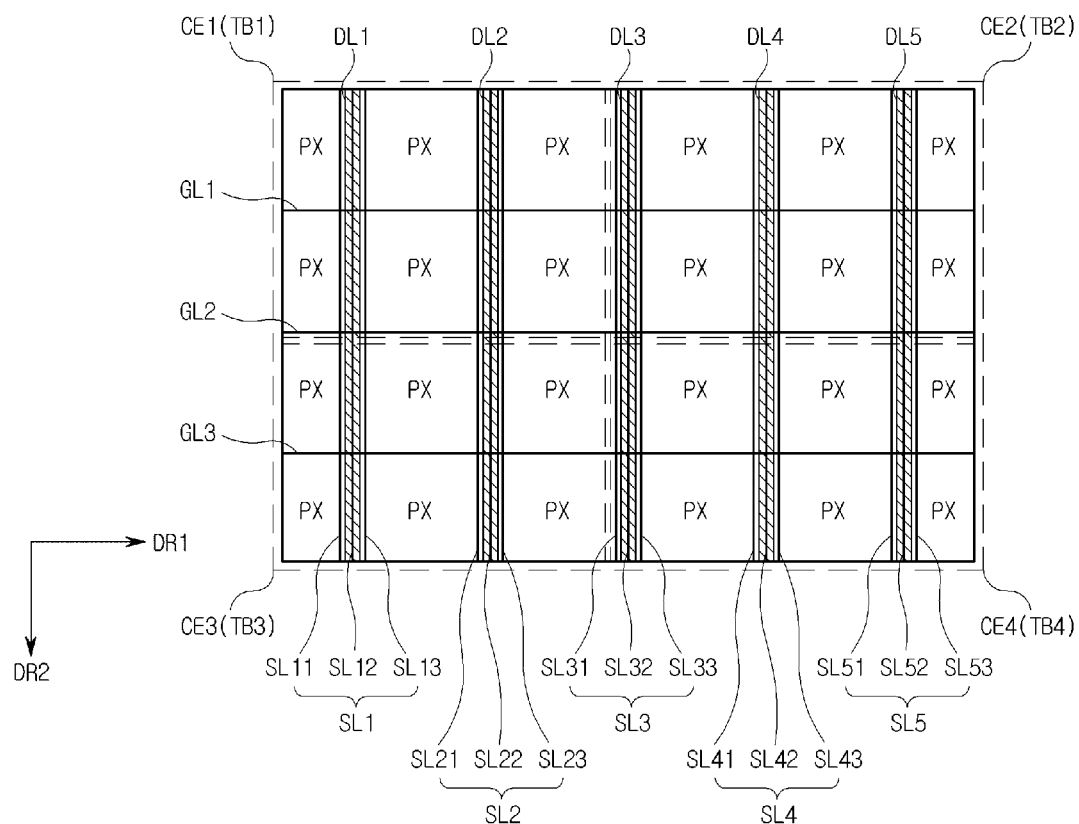
FIG. 2 is a plan view schematically illustrating an area of a display panel illustrated in FIG. 1.
Figure 3:
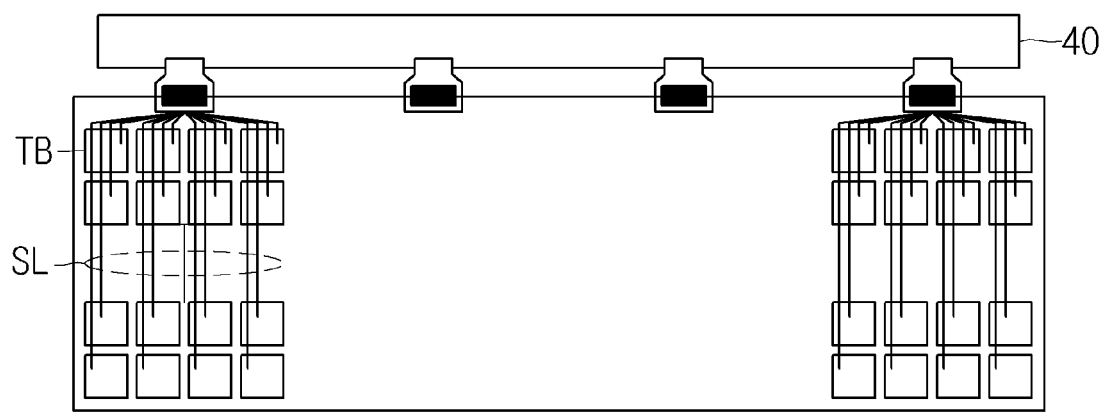
FIG. 3 is a conceptual diagram illustrating a touch block of a display panel shown in FIG. 1.

FIG. 2 is a plan view schematically showing an area of the display panel shown in FIG. 1. Specifically, FIG. 2 specifically shows an arrangement relationship of a data line DL, a gate line GL, and a sensing line SL provided on the display panel 50. FIG. 3 is a conceptual diagram illustrating a touch block TB of the display panel shown in FIG. 1.

Referring to FIG. 2, the display panel 50 according to an aspect includes a plurality of sub-pixels PXs, and gate lines GL1, GL2, and GL3 and data lines DL1, DL2, DL3, DL4, and DL5 that apply gate signals and data signals to the plurality of sub-pixels PXs, respectively.

The gate lines GL1, GL2, and GL3 extend in a first direction DR1 between rows of sub-pixels. Each of the gate lines GL1, GL2, and GL3 transmits the gate signal applied from the gate driving unit 20 to the sub-pixels PXs connected thereto.

The data lines DL1, DL2, DL3, DL4, and DL5 extend in a second direction DR2 substantially perpendicular to the first direction DR1 between columns of sub-pixels. Each of the data lines DL1, DL2, DL3, DL4, and DL5 transmits the data signal applied from the data driving unit 30 to the sub-pixels PXs connected thereto.

The sensing lines SL1, SL2, SL3, SL4, and SL5 are disposed to be overlapped with the data lines DL1, DL2, DL3, DL4, and DL5, respectively. Each of the sensing lines SL1, SL2, SL3, SL4, and SL5 may be connected to corresponding common electrodes CE1, CE2, CE3, and CE4. The common electrodes CE1, CE2, CE3, and CE4 may be disposed one-to-one with respect to the touch blocks TB1, TB2, TB3, and TB4.

The sensing lines SL1, SL2, SL3, SL4, and SL5 receive a common voltage and transmit the same to the common electrodes CE1, CE2, CE3, and CE4 during a display period, and receive a common touch scan signal and transmit the same to the common electrodes CE1, CE2, CE3, and CE4 during the touch detection period.

According to an aspect, each of the sensing lines SL1, SL2, SL3, SL4, and SL5 may be configured with a plurality of sub-sensing lines SL11, SL12, SL13, SL21, SL22, SL23, SL31, SL32, SL33, SL41, SL42, SL43, SL51, SL52, and SL53. As shown in FIG. 3, one sub-sensing line SL11, SL12, SL13, SL21, SL22, SL23, SL31, SL32, SL33, SL41, SL42, SL43, SL51, SL52, or SL53 may be connected one to one to one common electrode CE1, CE2, CE3, or CE4 provided in one sub-pixel PX. That is, one sub-sensing line SL11, SL12, SL13, SL21, SL22, SL23, SL31, SL32, SL33, SL41, SL42, SL43, SL51, SL52, or SL53 may be electrically connected to one common electrode CE1, CE2, CE3, or CE4.

In FIG. 2, each of the sensing lines SL1, SL2, SL3, SL4, and SL5 is configured with three sub-sensing lines SL11, SL12, SL13, SL21, SL22, SL23, SL31, SL32, SL33, SL41, SL42, SL43, SL51, SL52, and SL53, but this aspect is not limited thereto. That is, according to various aspects, the number of sub-sensing lines SL11, SL12, SL13, SL21, SL22, SL23, SL31, SL32, SL33, SL41, SL42, SL43, SL51, SL52, and SL53 constituting one sensing line SL1, SL2, SL3, SL4, or SL5 may be variously determined according to the size of the display panel 50 and the number of sub-pixels per unit area.

Figure 4:
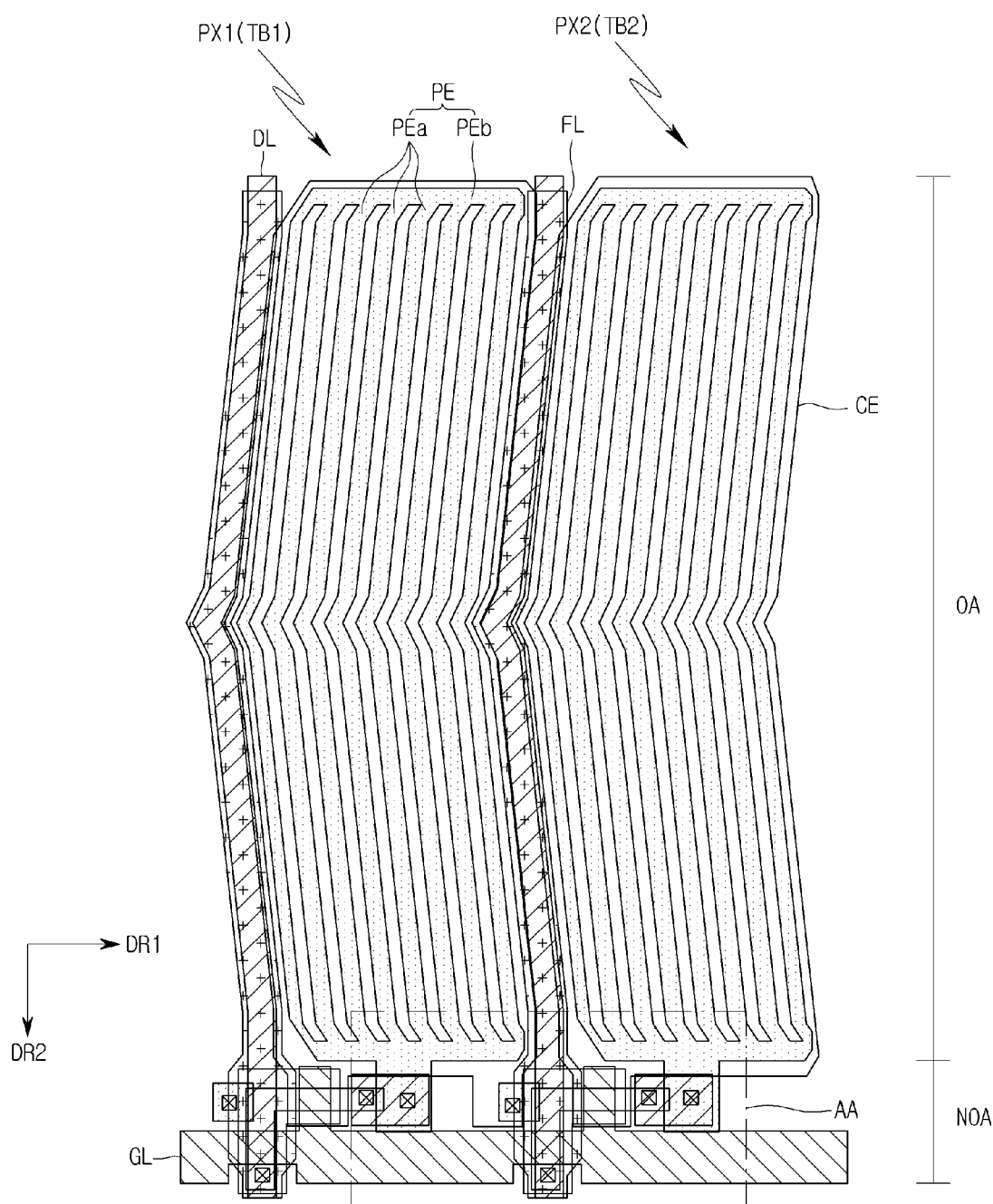
FIG. 4 is a plan view illustrating a layout of a sub-pixel according to an aspect of the present disclosure.
Figure 5:
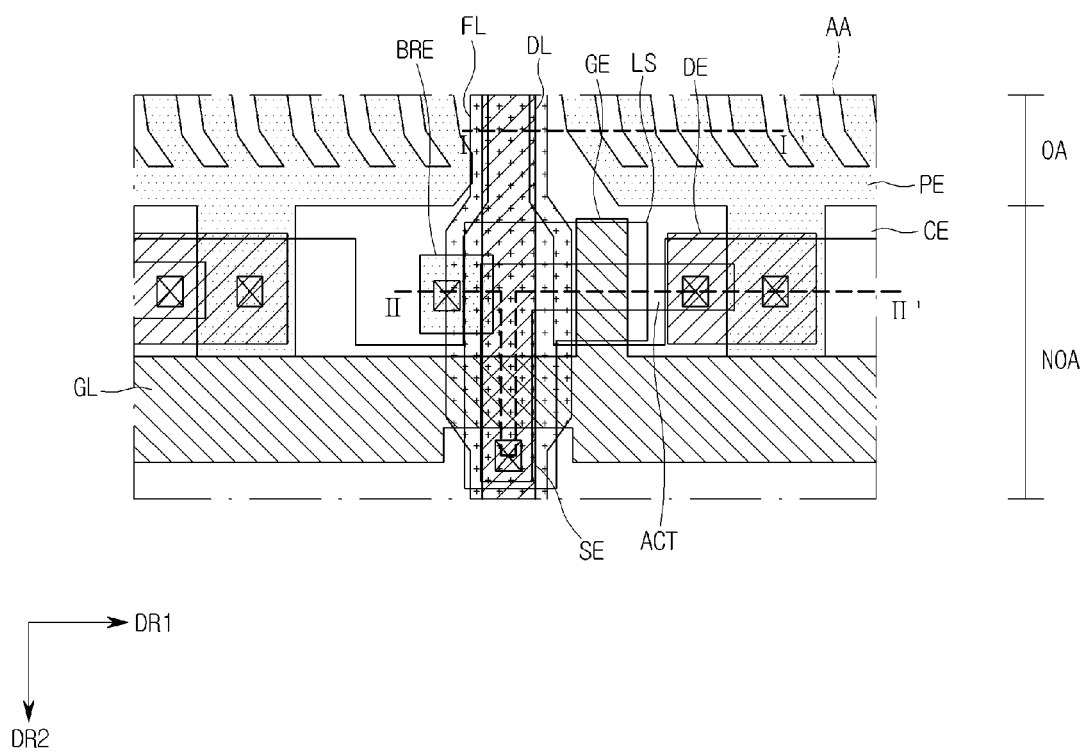
FIG. 5 is an enlarged plan view illustrating area AA of FIG. 4.
Figure 6:
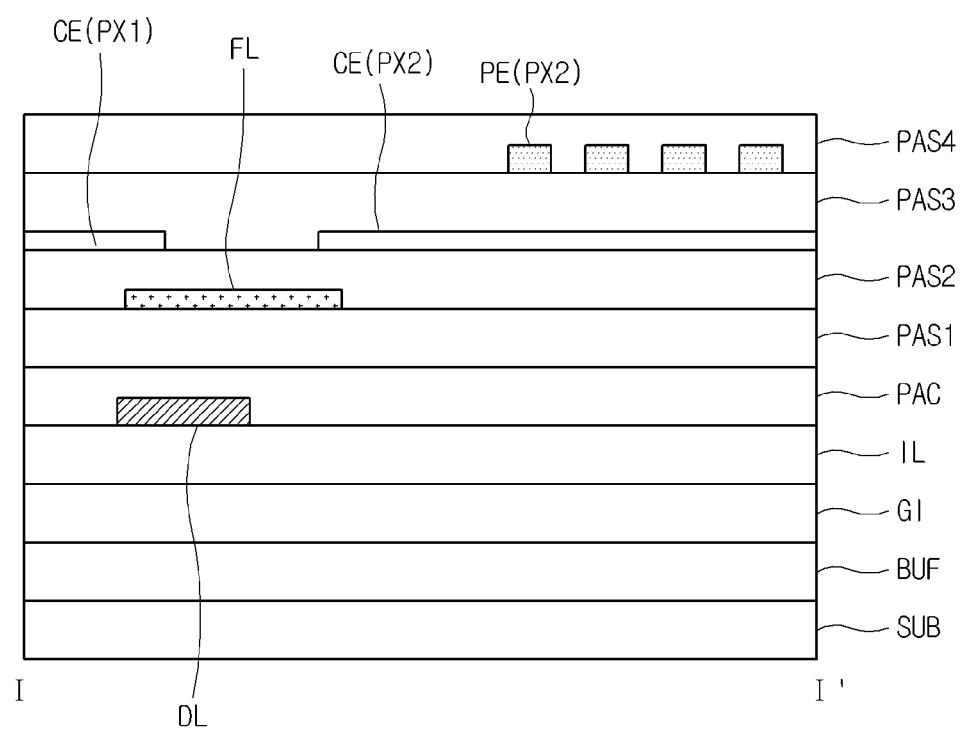
FIG. 6 is a cross-sectional view taken along line I-I' in FIG. 5.
Figure 7:
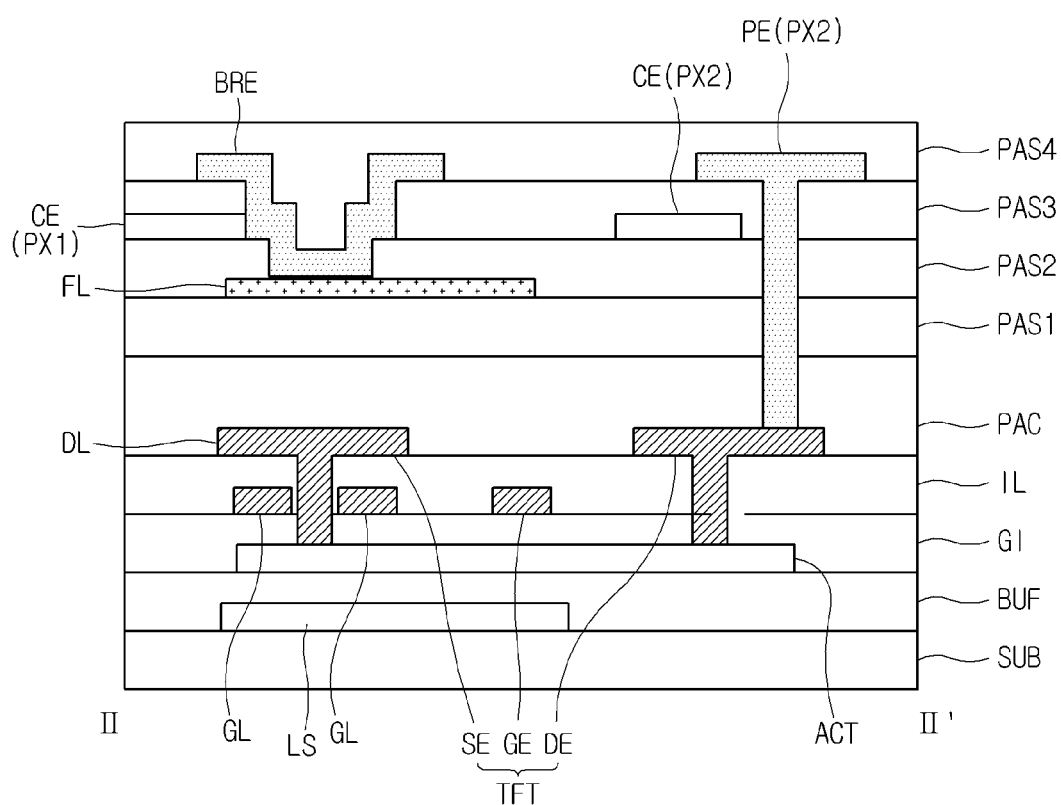
FIG. 7 is a cross-sectional view taken along line II-II' of FIG. 5.

FIG. 4 is a plan view illustrating a layout of a sub-pixel according to an aspect of the present disclosure. FIG. 5 is an enlarged plan view illustrating area AA of FIG. 4. FIG. 6 is a cross-sectional view taken along a line I-I' of FIG. 5. FIG. 7 is a cross-sectional view taken along a line II-II' of FIG. 5. Here, sub-pixels PX1 and PX2 illustrated in FIGS. 4 to 7 are disposed in different touch blocks TB1 and TB2, respectively, and disposed adjacent to each other at the boundary of touch blocks TB1 and TB2.

Referring to FIGS. 4 to 7, each of the sub-pixels PX1 and PX2 includes an opening area OA in which an image is displayed by an electric field between a pixel electrode PE and a common electrode CE, and a non-opening area NOA that has a driving element, for example, a thin film transistor TFT, disposed for driving the common electrode CE and the pixel electrode PE of the opening area OA and that surrounds the opening area. Here, the opening area OA may be a display area in which an image is displayed, and the non-opening area NOA may be a non-display area in which an image is not displayed.

The pixel electrode PE and the common electrode CE are disposed in the opening area.

The pixel electrode PE forms an electric field with a common electrode CE to which a common voltage is applied during a display period in one frame. The pixel electrode PE includes branch portions PEas arranged side by side at equal intervals and a stem portion PEb connecting the branch portions PEa to each other. The pixel electrode PE is generally formed in the opening area OA, and may be arranged in such a manner as to extend from the opening area OA to the non-opening area NOA.

The common electrode CE may be formed widely in the touch blocks TB1 and TB2.

The data line DL, the gate line GL, and the thin film transistor TFT may be disposed in the non-opening area NOA.

The data line DL extends along a second direction DR2 in the non-opening area NOA between the sub-pixels PX1 and PX2. The gate line GL extends along a first direction DR1 in such a manner as to cross the non-opening area NOA of the sub-pixels PX1 and PX2. In order to clarify the description of this aspect, the sensing line SL is not illustrated. However, the sensing line SL may be disposed in the non-opening area NOA between the sub-pixels PX1 and PX2. The sensing line SL may be arranged to be overlapped with the data line DL.

The thin film transistor TFT includes a gate electrode GE connected to the gate line GL, a source electrode SE connected to the data line DL, and a drain electrode DE spaced apart from the source electrode SE. The drain electrode DE of the thin film transistor TFT may be connected to the pixel electrode PE through a contact hole.

According to an aspect, each of the sub-pixels PX1 and PX2 may further include a dummy line FL. The dummy line FL extends along the second direction DR2 in the non-opening area NOA between the sub-pixels PX1 and PX2. The dummy line FL may be arranged to be overlapped with the data line DL.

According to an aspect, the dummy line FL may be at a floating state in such a manner as to be electrically separated from other wires and/or electrodes of a circuit element. Herein, when the data signal is applied to the data line DL, the data voltage corresponding to the data signal may be transferred to the dummy line FL. When an electric field is formed between the pixel electrode PE and the dummy line FL to which the data voltage is transferred, a disclination occurs in the liquid crystal tilted by the electric field between the pixel electrode PE and the common electrode CE, so that the image may not be correctly displayed. In addition, since the dummy line FL extends along the second direction DR2 at the boundary of the sub-pixels PX1 and PX2, a vertical band-like defect may occur in the display panel 50.

According to this aspect, in order to solve the above-described problem, the dummy line FL is connected the common electrode CE, so that the common voltage applied to the common electrode CE during the display period is equally applied to the dummy line FL. Then, since the voltage of the dummy line FL is stabilized to the common voltage, it is possible to resolve a vertical band-like defect caused due to the electric field effect generated in the dummy line FL.

Hereinafter, a detailed stack structure of the sub-pixels PX1 and PX2 described above with reference to FIGS. 6 and 7 will be described in detail.

The substrate SUB may be a light transmitting substrate, as a base substrate of the display panel 50. The substrate SUB may be a rigid substrate including glass or tempered glass, or a flexible substrate made of plastic material. For example, the substrate SUB may be formed of plastic materials, such as polyimide, polyethylene terephthalate (PET), polyethylene naphthalate (PEN), polycarbonate (PC), and the like. However, the material of the substrate SUB is not limited thereto.

An opening area OA and a non-opening area NOA are formed on the substrate SUB. The opening area OA may be defined as an area where an image is displayed according to an electric field between the pixel electrode PE and the common electrode CE. The non-opening area NOA may be defined as a driving element for driving the common electrode CE and the pixel electrode PE of the opening area (OA), for example, an area in which a thin film transistor TFT and wirings are disposed.

A light blocking layer LS may be formed on the substrate SUB. The light blocking layer LS is disposed to be overlapped with a semiconductor pattern of the thin film transistor TFT, particularly, a channel region of the active layer ACT on a plane, thereby protecting the oxide semiconductor device from external light.

The buffer layer BUF covers the light blocking layer LS. The buffer layer BUF may prevent ions or impurities from being diffused from the substrate SUB and block moisture penetration. In addition, the buffer layer BUF may improve surface flatness of the substrate SUB. The buffer layer BUF may include an inorganic material such as oxide and nitride, an organic material, or an organic-inorganic complex material, and may be formed in a single layer or multi-layer structure. For example, the buffer layer BUF may have a structure of three or more layers consisting of silicon oxide, silicon nitride, and silicon oxide.

The active layer ACT is formed on the buffer layer BUF. The active layer ACT may be formed of a silicon-based semiconductor material or an oxide-based semiconductor material. Amorphous silicon or polycrystalline silicon may be used as the silicon-based semiconductor material. As the oxide-based semiconductor material, a quaternary metal oxide such as indium tin gallium zinc oxide (InSnGaZnO), ternary metal oxides such as indium gallium zinc oxide (InGaZnO), indium tin zinc oxide (InSnZnO), indium aluminum zinc oxide (InAlZnO), tin gallium zinc oxide (SnGaZnO), aluminum gallium zinc oxide (AlGaZnO), and tin aluminum zinc oxide (SnAlZnO), binary metal oxide such as indium zinc oxide (InZnO), tin zinc oxide (SnZnO), aluminum zinc oxide (AlZnO), zinc magnesium oxide (ZnMgO), tin magnesium oxide (SnMgO), indium magnesium oxide (InMgO), indium gallium oxide (InGaO), and signal metal oxide such as indium oxide (InO), tin oxide (SnO), and zinc oxide (ZnO), and the like.

The active layer ACT may include a source region and a drain region containing p-type or n-type impurities, and a channel formed between the source region and the drain region.

A gate insulating layer GI may be formed on the active layer ACT. The gate insulating layer GI may be silicon oxide (SiOx), silicon nitride (SiNx), or multiple layers thereof.

A first conductive layer is formed on the gate insulating layer GI. The first conductive layer may include a gate electrode GE. The gate electrode GE may be disposed to be overlapped with the channel of the corresponding active layer ACT. The gate electrode GE is integrally formed with a wiring electrically connected to the gate electrode GE, thereby forming one pattern. For example, the gate electrode GE may be a branched region of the gate line GL.

The insulating layer IL may cover the first conductive layer. The insulating layer IL may be silicon oxide (SiOx), silicon nitride (SiNx), or multiple layers thereof.

A second conductive layer is formed on the insulating layer IL. The second conductive layer may include a source electrode SE and a drain electrode DE. In addition, the second conductive layer may further include a data line DL. The source electrode SE and the drain electrode DE may be connected to the source region and the drain region of the active layer ACT, respectively. According to an aspect, at least one of the source electrode SE and the drain electrode DE may be formed integrally with a wiring electrically connected, thereby forming one pattern. For example, the source electrode SE may be a branched region of the data line DL.

A planarization layer PAC covers the second conductive layer. The planarization layer PAC may be provided to alleviate a step difference in the underlying structure. The planarization layer PAC may be formed of organic materials such as polyimide, benzocyclobutene series resin, and acrylate.

Although the illustration is omitted to clarify the description of the present aspect, the sensing line SL may be formed on the planarization layer PAC. The sensing line SL may consist of, for example, first to third sub-sensing lines SL1, SL2, and SL3. At least some or all of the first to third sub-sensing lines SL1, SL2, and SL3 may be disposed to be overlapped with the data line DL. The sensing line SL may be covered by the first passivation layer PAS1.

According to this aspect, a third conductive layer is formed on the first passivation layer PAS1. The third conductive layer may include a dummy line FL. The dummy line FL may be disposed to be overlapped with the data line DL. The dummy line FL may be covered by the second passivation layer PAS2. In this aspect, the dummy line FL may be electrically connected to a common electrode CE, which will be described later.

The common electrode CE is formed on the second passivation layer PAS2. The common electrode CE is formed wide in the opening area OA and the non-opening area NOA in the respective touch blocks TB1 and TB2. Since the common electrode CE is formed on a per-touch block TB basis, the common electrode CE is separated from the boundary between the touch blocks TB1 and TB2. For example, the common electrode CE may be disposed so as not to be overlapped with the data line DL located at the boundary of the touch blocks TB1 and TB2. However, this aspect is not limited thereto.

According to an aspect, the common electrode CE may include an opening in at least one region. For example, the common electrode CE may have an opening in a region where the drain electrode DE and the pixel electrode PE are in contact. Accordingly, the electric field formed between the drain electrode DE and the pixel electrode PE may be prevented from affecting the common electrode CE.

According to this aspect, the common electrode CE is electrically connected to the dummy line FL. Accordingly, the common voltage applied to the common electrode CE during the display period in one frame is transmitted to the dummy line FL, so that the voltage of the dummy line FL may be stabilized. According to this aspect, the common electrode CE may be in direct contact with the dummy line FL through the contact hole, or may be electrically connected to the dummy line FL via a bridge electrode BRE, which will be described below.

A third passivation layer PAS3 may be formed on the common electrode CE. The first to third passivation layers PAS1, PAS2, and PAS3 may be a silicon oxide film (SiOx), a silicon nitride film (SiNx), or multiple layers thereof, as insulating films for protecting the covered elements.

A pixel electrode PE may be formed on the third passivation layer PAS3. The pixel electrode PE is generally formed in the opening area OA, and may be arranged to extend from the opening area to the non-opening area (NOA). According to an aspect, the pixel electrode PE may include branch portions PEas arranged side by side at the same interval and a stem portion PEb connecting the branch portions PEas. The pixel electrode PE is electrically connected to the drain electrode DE through a contact hole.

According to this aspect, a bridge electrode BRE may be further formed on the third passivation layer PAS3. The bridge electrode BRE is formed in a non-opening area NOA and may be an island-shaped electrode spaced apart from the pixel electrode PE. The bridge electrode BRE has one region connected to the common electrode CE and the other region connected to the dummy line FL. The bridge electrode BRE may electrically connect the common electrode CE and the dummy line FL.

As described above, according to the present aspect, the dummy line FL is connected to the common electrode CE, so that the common voltage applied to the common electrode CE during the display period is equally applied to the dummy line FL. Then, since the voltage of the dummy line FL is stabilized to the common voltage, it is possible to resolve a vertical band-like defect caused due to the electric field effect generated in the dummy line FL.

A fourth passivation layer PAS4 may be provided on the third passivation layer PAS3 to cover lower elements.

In the foregoing, it is described that the dummy line FL formed in the non-opening area NOA between the sub-pixels PX1 and PX2 is connected to the common electrode CE, at the boundary of the touch blocks TB1 and TB2, but the present aspect is not limited thereto. That is, in various aspects, the dummy line FL formed in the non-opening area NOA of the sub-pixels PX disposed within the touch blocks TB1 and TB2 is connected to the common electrode CE, thereby stabilizing the voltage. Hereinafter, this aspect will be described in more detail.

Figure 8:
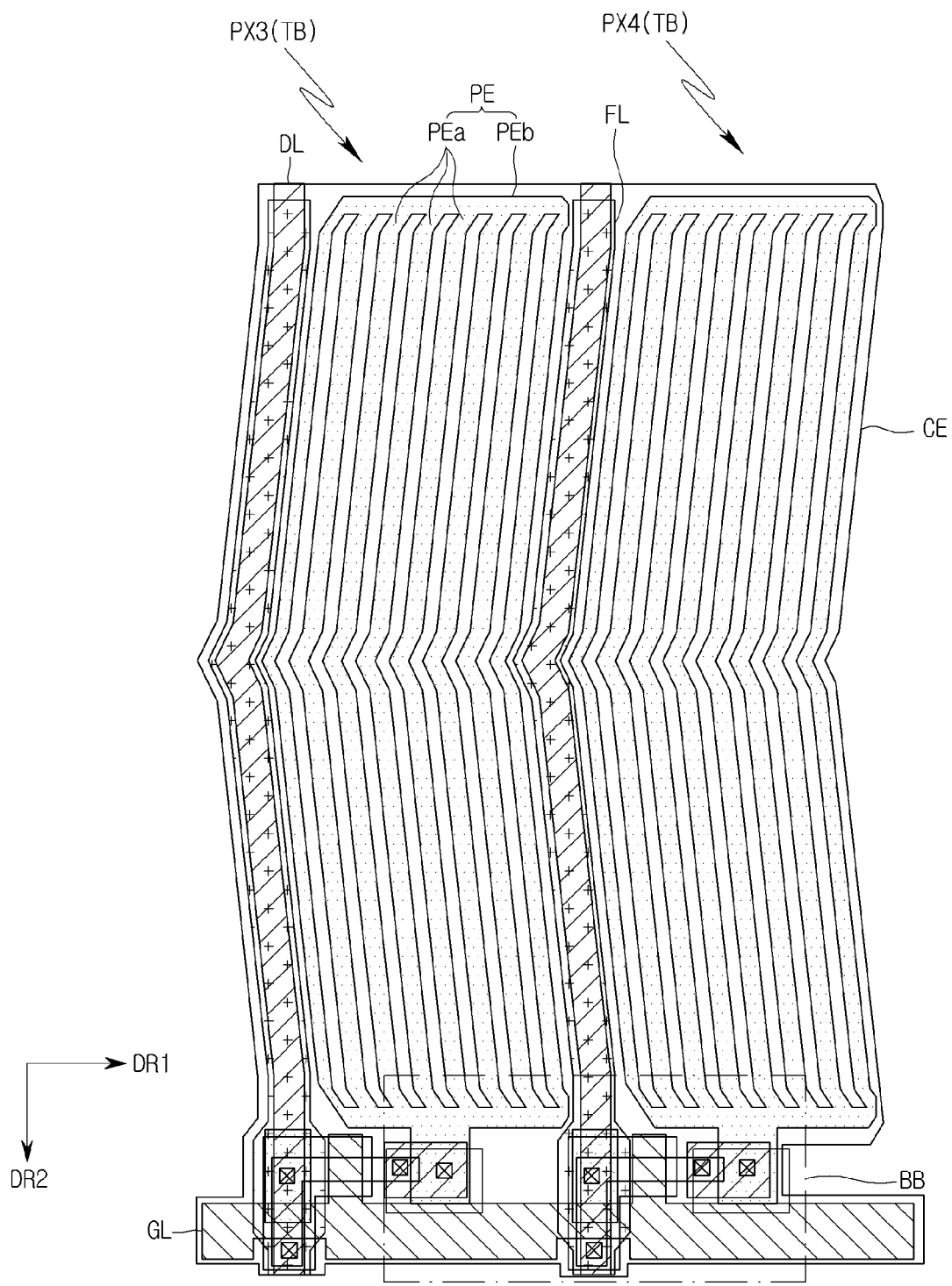
FIG. 8 is a plan view illustrating a layout of a sub-pixel according to another aspect of the present disclosure.
Figure 9:
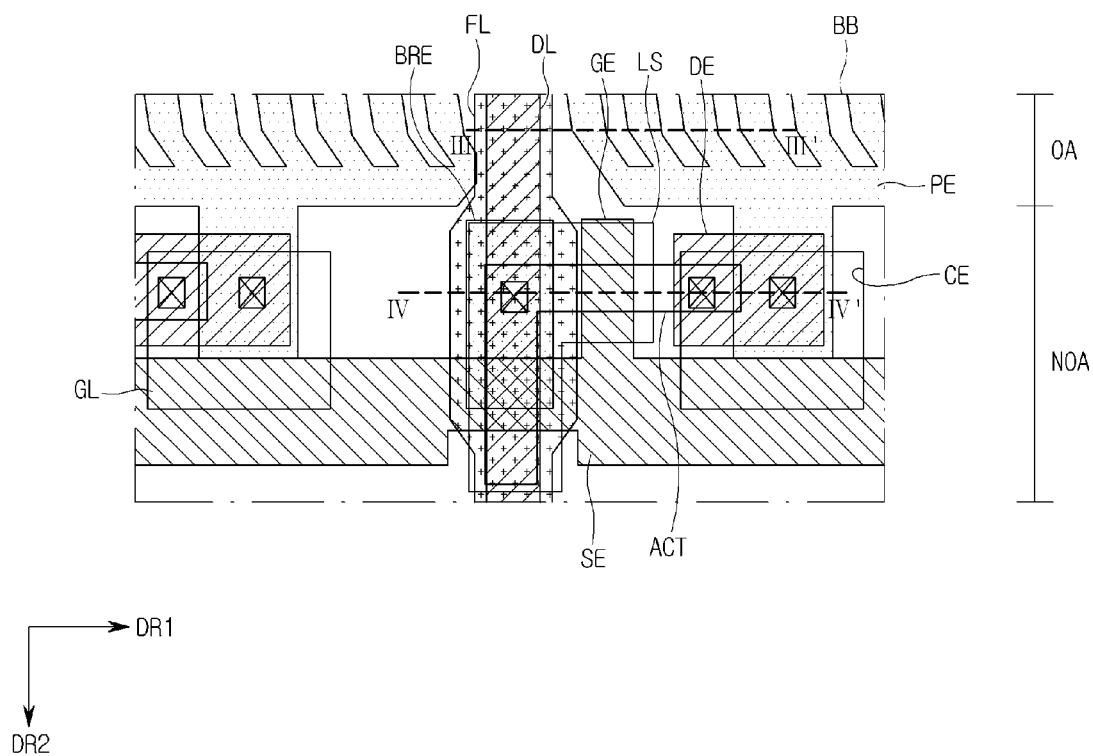
FIG. 9 is an enlarged plan view illustrating area BB of FIG. 8.
Figure 10:
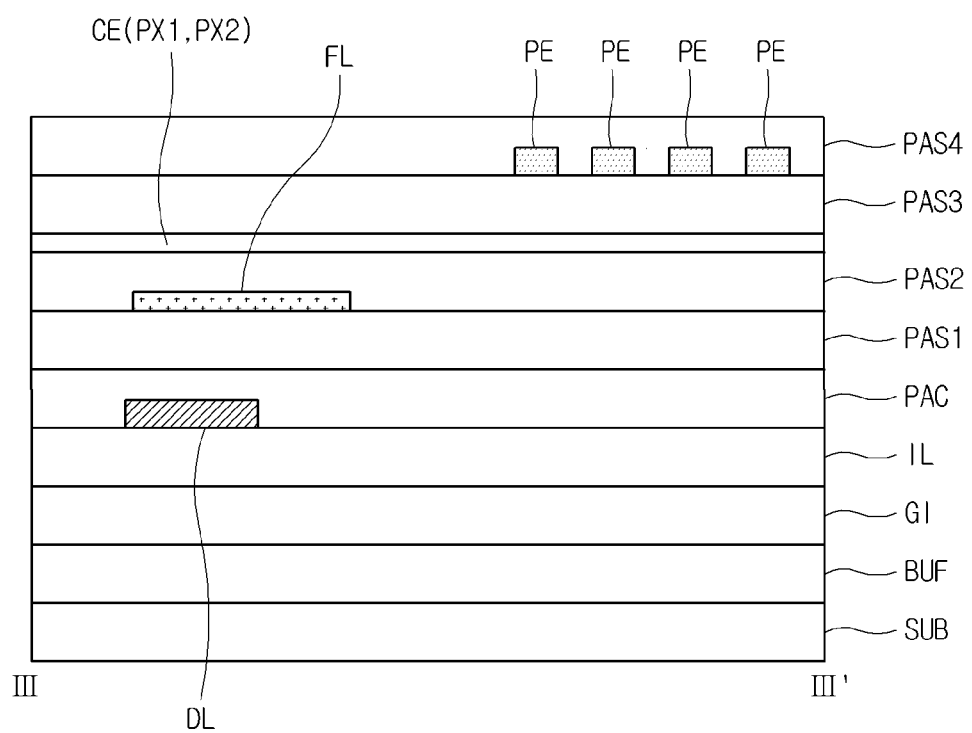
FIG. 10 is a cross-sectional view taken along line III-III' of FIG. 9.
Figure 11:
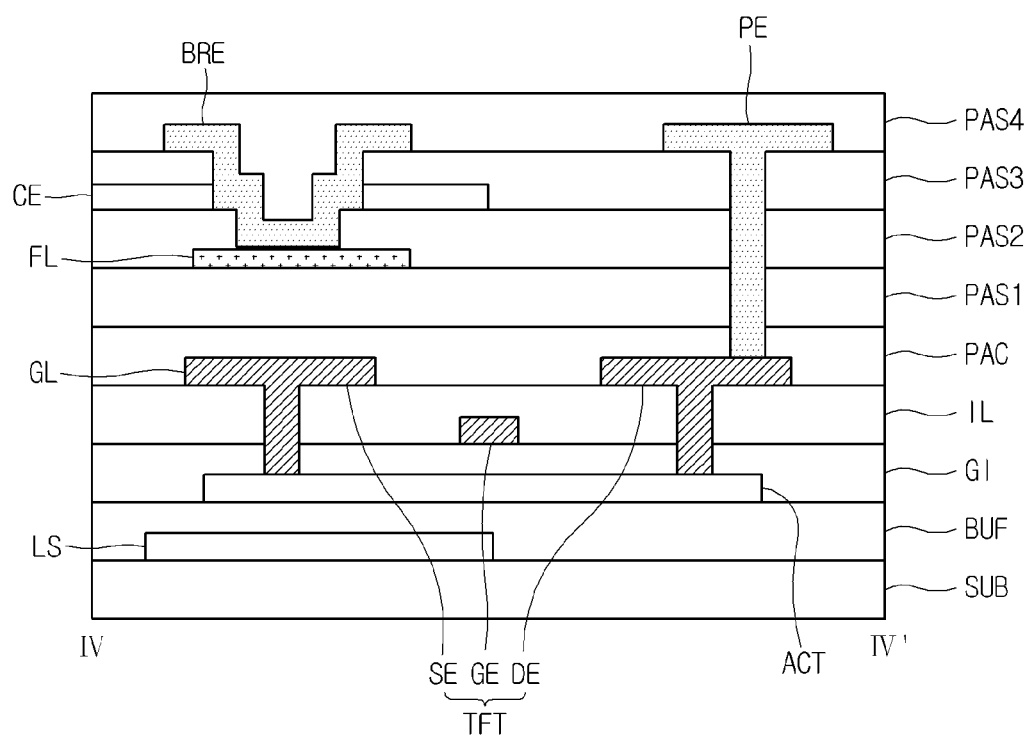
FIG. 11 is a cross-sectional view taken along line IV-IV' of FIG. 9.

FIG. 8 is a plan view illustrating a layout of a sub-pixel according to another aspect. FIG. 9 is an enlarged plan view illustrating an area BB of FIG. 8. FIG. 10 is a cross-sectional view taken along a line III-III' of FIG. 9. FIG. 11 is a cross-sectional view taken along a line IV-IV' of FIG. 9. Herein, the sub-pixels PX3 and PX4 shown in FIGS. 8 to 11 are arranged to be adjacent each other in one touch block TB.

Referring to FIGS. 8 to 11, each of the sub-pixels PX3 and PX4 according to an aspect includes an opening area OA in which an image is displayed by an electric field between common electrodes CE, and a non-opening area NOA that has a driving element, for example, a thin film transistor (TFT) disposed for driving the common electrode CE and the pixel electrode PE of the opening area OA that surrounds the opening area.

A pixel electrode PE and a common electrode CE are disposed in the opening area.

The pixel electrode PE forms an electric field with a common electrode CE to which a common voltage is applied during a display period in one frame. The pixel electrode PE includes branch portions PEas arranged side by side at equal intervals and a stem portion PEb connecting the branch portions PEa to each other. The pixel electrode PE is generally formed in the opening area OA, and may be arranged in such a manner as to extend from the opening area OA to the non-opening area NOA.

The common electrode CE may be formed widely in the touch block TB.

The data line DL, the gate line GL, and the thin film transistor TFT may be disposed in the non-opening area NOA.

The data line DL extends along a second direction DR2 in the non-opening area NOA between the sub-pixels PX1 and PX2. The gate line GL extends along a first direction DR1 in such a manner as to cross the non-opening area NOA of the sub-pixels PX1 and PX2. In order to clarify the description of this aspect, the sensing line SL is not illustrated. However, the sensing line SL may be disposed in the non-opening area NOA between the sub-pixels PX1 and PX2. The sensing line SL may be arranged to be overlapped with the data line DL.

The thin film transistor TFT includes a gate electrode GE connected to the gate line GL, a source electrode SE connected to the data line DL, and a drain electrode DE spaced apart from the source electrode SE. The drain electrode DE of the thin film transistor TFT may be connected to the pixel electrode PE through a contact hole.

According to an aspect of the present disclosure, each of the sub-pixels PX1 and PX2 may further include a dummy line FL. The dummy line FL extends along the second direction DR2 in the non-opening area NOA between the sub-pixels PX1 and PX2. The dummy line FL may be arranged to be overlapped with the data line DL. The dummy line FL is connected to the common electrode CE, so that the common voltage applied to the common electrode CE during the display period is equally applied to the dummy line FL.

Hereinafter, a detailed stack structure of the sub-pixels PX3 and PX4 described above will be described in detail with reference to FIGS. 10 and 11.

The substrate SUB may be a light transmitting substrate, as a base substrate of the display panel 50. The substrate SUB may be a rigid substrate including glass or tempered glass, or a flexible substrate made of plastic material An opening area OA and a non-opening area NOA are formed on the substrate SUB. The opening area OA may be defined as an area where an image is displayed according to an electric field between the pixel electrode PE and the common electrode CE. The non-opening area NOA may be defined as a driving element for driving the common electrode CE and the pixel electrode PE of the opening area (OA), for example, an area in which a thin film transistor TFT and wirings are disposed.

A light blocking layer LS may be formed on the substrate SUB. The light blocking layer LS is disposed to be overlapped with a semiconductor pattern of the thin film transistor TFT, particularly, a channel region of the active layer ACT on a plane, thereby protecting the oxide semiconductor device from external light.

The buffer layer BUF covers the light blocking layer LS. The buffer layer BUF may prevent ions or impurities from being diffused from the substrate SUB and block moisture penetration.

An active layer ACT is formed on the buffer layer BUF. The active layer ACT may be formed of a silicon-based semiconductor material or an oxide-based semiconductor material. The active layer ACT may include a source region and a drain region containing p-type or n-type impurities, and a channel formed between the source region and the drain region.

A gate insulating layer GI may be formed on the active layer ACT. The gate insulating layer GI may be silicon oxide (SiOx), silicon nitride (SiNx), or multiple layers thereof.

A first conductive layer is formed on the gate insulating layer GI. The first conductive layer may include a gate electrode GE. The gate electrode GE may be disposed to be overlapped with the channel of the corresponding active layer ACT. The gate electrode GE is integrally formed with a wiring electrically connected to the gate electrode GE, thereby forming one pattern. For example, the gate electrode GE may be a branched region of the gate line GL.

The insulating layer IL may cover the first conductive layer. The insulating layer IL may be silicon oxide (SiOx), silicon nitride (SiNx), or multiple layers thereof.

A second conductive layer is formed on the insulating layer IL. The second conductive layer may include a source electrode SE and a drain electrode DE. In addition, the second conductive layer may further include a data line DL. The source electrode SE and the drain electrode DE may be connected to the source region and the drain region of the active layer ACT, respectively. According to an aspect, at least one of the source electrode SE and the drain electrode DE may be formed integrally with a wiring electrically connected, thereby forming one pattern. For example, the source electrode SE may be a branched region of the data line DL.

A planarization layer PAC covers the second conductive layer. The planarization layer PAC may be provided to alleviate a step difference in the underlying structure. The planarization layer PAC may be formed of organic materials such as polyimide, benzocyclobutene series resin, and acrylate.

Although the illustration is omitted to clarify the description of the present aspect, the sensing line SL may be formed on the planarization layer PAC. The sensing line SL may consist of, for example, first to third sub-sensing lines SL1, SL2, and SL3. At least some or all of the first to third sub-sensing lines SL1, SL2, and SL3 may be disposed to be overlapped with the data line DL. The sensing line SL may be covered by the first passivation layer PAS1.

According to this aspect, a third conductive layer is formed on the first passivation layer PAS1. The third conductive layer may include a dummy line FL. The dummy line FL may be disposed to be overlapped with the data line DL. The dummy line FL may be covered by the second passivation layer PAS2. In this aspect, the dummy line FL may be electrically connected to a common electrode CE, which will be described later.

The common electrode CE is formed on the second passivation layer PAS2. The common electrode CE is widely formed in the opening area OA and the non-opening area NOA in the touch block TB. According to an aspect, the common electrode CE may include an opening in at least one region. For example, the common electrode CE may have an opening in a region where the drain electrode DE and the pixel electrode PE are in contact. Accordingly, the electric field formed between the drain electrode DE and the pixel electrode PE may be prevented from affecting the common electrode CE.

According to this aspect of the present disclosure, the common electrode CE is electrically connected to the dummy line FL. Accordingly, the common voltage applied to the common electrode CE during the display period in one frame is transmitted to the dummy line FL, so that the voltage of the dummy line FL may be stabilized. According to this aspect, the common electrode CE may be in direct contact with the dummy line FL, or may be electrically connected to the dummy line FL via a bridge electrode BRE, which will be described below.

A third passivation layer PAS3 may be formed on the common electrode CE. The first to third passivation layers PAS1, PAS2, and PAS3 may be a silicon oxide film (SiOx), a silicon nitride film (SiNx), or multiple layers thereof, as insulating films for protecting the covered elements.

A pixel electrode PE may be formed on the third passivation layer PAS3. The pixel electrode PE is generally formed in the opening area OA, and may be arranged to extend from the opening area to the non-opening area (NOA). According to an aspect, the pixel electrode PE may include branch portions PEas arranged side by side at the same interval and a stem portion PEb connecting the branch portions PEas. The pixel electrode PE is electrically connected to the drain electrode DE through a contact hole.

According to this aspect, a bridge electrode BRE may be further formed on the third passivation layer PAS3. The bridge electrode BRE is formed in a non-opening area NOA and may be an island-shaped electrode spaced apart from the pixel electrode PE. The bridge electrode BRE has one region connected to the common electrode CE and the other region connected to the dummy line FL. The bridge electrode BRE may electrically connect the common electrode CE and the dummy line FL.

As described above, according to the present aspect, the dummy line FL is connected to the common electrode CE, so that the common voltage applied to the common electrode CE during the display period is equally applied to the dummy line FL. Then, since the voltage of the dummy line FL is stabilized to the common voltage, it is possible to resolve a vertical band-like defect caused due to the electric field effect generated in the dummy line FL.

A fourth passivation layer PAS4 may be provided on the third passivation layer PAS3 to cover lower elements.

Those of ordinary skill in the art to which the present disclosure pertains will appreciate that the present disclosure may be implemented in other specific forms without changing its technical spirit or essential features. Therefore, it should be understood that the aspects described above are illustrative in all respects and not restrictive. The scope of the present disclosure is indicated by the scope of the claims, which will be described later, rather than the detailed description, and it will be appreciated that all the changed or modified forms derived from the meaning and scope of the claims and their equivalent concepts are included in the scope of the present disclosure.

What is claimed is:

1. A display device, comprising:
a plurality of pixel electrodes;
a plurality of common electrodes overlapping with at least one of the pixel electrodes;
a plurality of gate lines extending along a first direction;
a plurality of data lines extending along a second direction;
a plurality of dummy lines overlapping with the data lines, the plurality of dummy lines having a first dummy line and a second dummy line; and
a plurality of sensing lines overlapping with the data lines,
wherein the first dummy line is connected to adjacent common electrode in a first area of touch blocks each including at least one of the plurality of common electrodes, and
wherein the second dummy line is not electrically connected to the plurality of pixel electrodes, the plurality of common electrodes, the plurality of gate lines, the plurality of data lines and the plurality of sensing lines in a second area of the touch blocks.

2. The display device of claim 1, wherein the first dummy line receives a common voltage during a display period of one frame.

3. The display device of claim 1, wherein each of the dummy lines is disposed between the data lines and the pixel electrodes.

4. The display device of claim 1, further comprising a bridge electrode connecting at least one of the plurality of common electrodes and the first dummy line.

5. The display device of claim 4, wherein the bridge electrode and the plurality of pixel electrodes are disposed on a same layer.

6. The display device of claim 5, wherein the bridge electrode includes an island-shaped electrode separated from the pixel electrodes.

7. The display device of claim 1, wherein the plurality of dummy lines are connected to corresponding touch blocks in the first area of the touch blocks, respectively.

8. The display device of claim 1, wherein the first area of the touch blocks is adjacent to boundary between the touch blocks.

9. A display device, comprising:
a substrate;
a first conductive layer disposed on the substrate and including gate lines;
a second conductive layer disposed on the first conductive layer and including data lines;
a plurality of first dummy lines and a plurality of second dummy lines disposed on the second conductive layer and each overlapping with the data lines;
a plurality of common electrodes disposed on the second conductive layer;
a plurality of pixel electrodes disposed on the common electrodes; and
a plurality of sensing lines each overlapping with the data lines,
wherein the plurality of first dummy lines are connected to adjacent common electrode in first areas of touch blocks each including at least one of the plurality of common electrodes, and
wherein the plurality of second dummy lines are not electrically connected to the plurality of pixel electrodes, the plurality of common electrodes, the gate lines, the data lines and the plurality of sensing lines in second areas of the touch blocks.

10. The display device of claim 9, further comprising a plurality of bridge electrodes disposed on a same layer as the plurality of common electrodes and each connecting the plurality of common electrodes and the plurality of first dummy lines.

11. The display device of claim 10, wherein each of the plurality of bridge electrodes include an island-shaped electrode separated from the plurality of pixel electrodes.

12. The display device of claim 10, wherein the plurality of dummy lines are connected to corresponding touch blocks in the plurality of first areas of the touch blocks, respectively.

13. The display device of claim 10, wherein the plurality of first areas of the touch blocks are adjacent to boundary between the touch blocks.

14. A display device, comprising:
a display panel having a plurality of sub-pixels, a plurality of common electrodes, and a plurality of pixel electrodes;
a gate driving unit configured to apply a gate signal to the sub-pixels;
a data driving unit configured to apply a data signal to the sub-pixels; and
a touch driving unit configured to apply a common voltage or a touch scan voltage to the plurality of common electrodes, wherein the display panel includes:
a plurality of gate lines connected to the pixel electrodes;
a plurality of data lines connected to the pixel electrodes;
a plurality of first and second dummy lines overlapping with the plurality of data lines and electrically connected to at least one of the plurality of common electrodes;
wherein each of the plurality of common electrodes is disposed in each of a plurality of touch blocks including at least two sub-pixels,
wherein the plurality of first dummy lines are connected to adjacent common electrode in a first area of a touch block, and
wherein the plurality of second dummy lines are not electrically connected to the plurality of pixel electrodes, the plurality of common electrodes, the plurality of gate lines and the plurality of data lines in a second area of the touch block.

15. The display device of claim 14, further comprising a plurality of bridge electrodes disposed on a same layer as the plurality of common electrodes and each connecting the plurality of common electrodes and the plurality of first dummy lines.

16. The display device of claim 15, wherein each of the plurality of bridge electrodes include an island-shaped electrode separated from the plurality of pixel electrodes.

17. The display device of claim 14, wherein the plurality of dummy lines are connected to a corresponding touch block in the first area of the touch block, respectively.

18. The display device of claim 14, wherein the first area of the touch block is adjacent to boundary of the touch block.

\* \* \* \* \*